(12) United States Patent
Scharfeld et al.

(10) Patent No.: US 8,525,677 B2
(45) Date of Patent: *Sep. 3, 2013

(54) BLISTER PACKAGE WITH INTEGRATED ELECTRONIC TAG AND METHOD OF MANUFACTURE

(75) Inventors: Tom Ahlkvist Scharfeld, Santa Barbara, CA (US); Richard Fletcher, Cambridge, MA (US)

(73) Assignees: Thomas Ahlkvist Scharfeld, Santa Barbara, CA (US); TagSense, Inc., Cambridge, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/400,565

(22) Filed: Feb. 20, 2012

(65) Prior Publication Data

US 2012/0145573 A1 Jun. 14, 2012

Related U.S. Application Data

(63) Continuation of application No. 10/906,606, filed on Feb. 25, 2005, now Pat. No. 8,120,492.

(51) Int. Cl.
*G08B 13/14* (2006.01)

(52) U.S. Cl.
USPC .................... 340/572.8; 340/572.1; 340/572.7

(58) Field of Classification Search
USPC ........ 340/572.1, 572.4, 572.7, 572.8, 539.11, 340/10.1; 235/385, 441; 221/1, 2, 9
See application file for complete search history.

(56) References Cited

U.S. PATENT DOCUMENTS

| | | | |
|---|---|---|---|
| 4,616,316 A * | 10/1986 | Hanpeter et al. | 221/2 |
| 7,034,689 B2 * | 4/2006 | Teplitxky et al. | 340/572.7 |
| 7,688,206 B2 * | 3/2010 | Carrender | 340/572.1 |
| 8,120,492 B2 * | 2/2012 | Scharfeld et al. | 340/572.7 |
| 2001/0028308 A1 * | 10/2001 | De La Huerga | 340/573.1 |

* cited by examiner

Primary Examiner — Van T. Trieu

(57) ABSTRACT

A blister package with an integrated RFID tag is provided. The conductive lidding material is modified to serve not only to seal some contents within some formed blister film, but also to act as an RFID tag antenna. An electronic circuit is electrically connected to the lidding film antenna. Methods of manufacture which integrate with conventional blister package manufacturing processes are also provided.

20 Claims, 21 Drawing Sheets

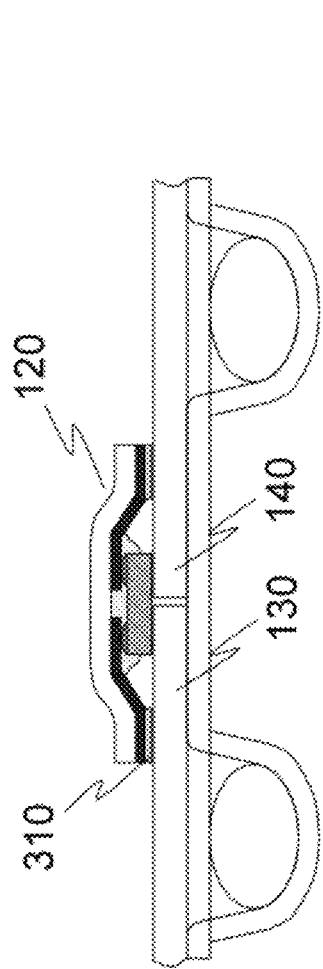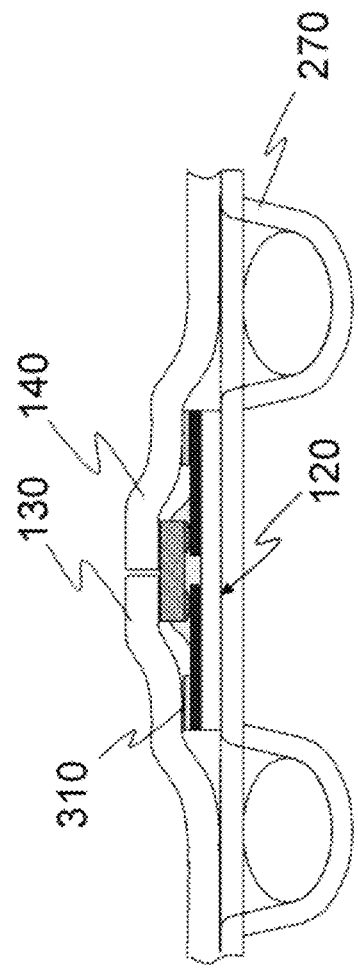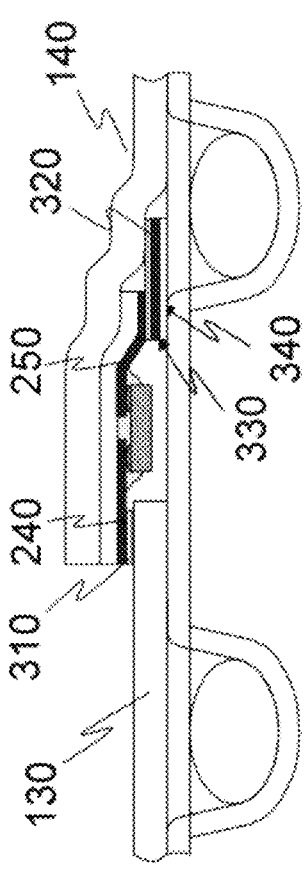

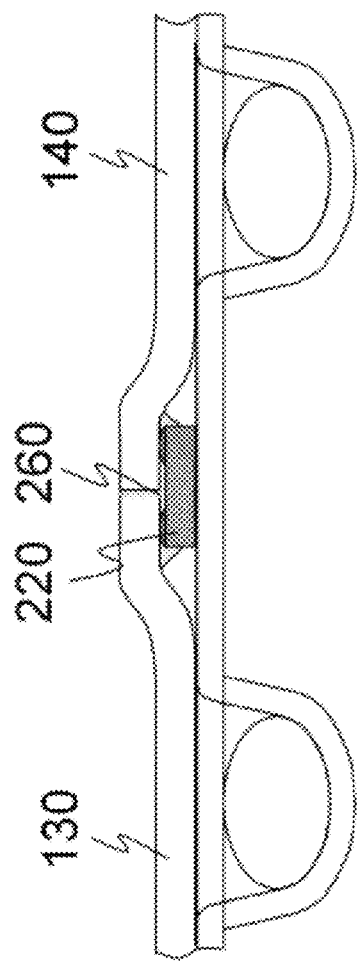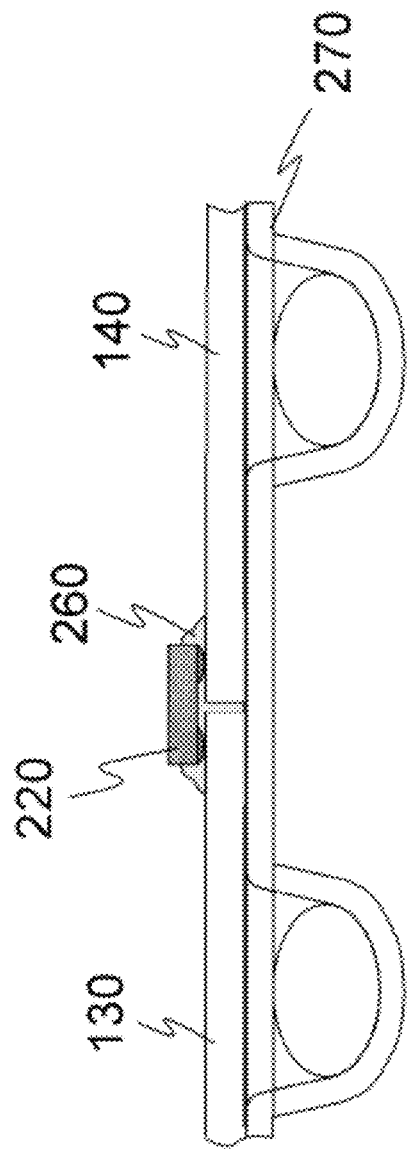

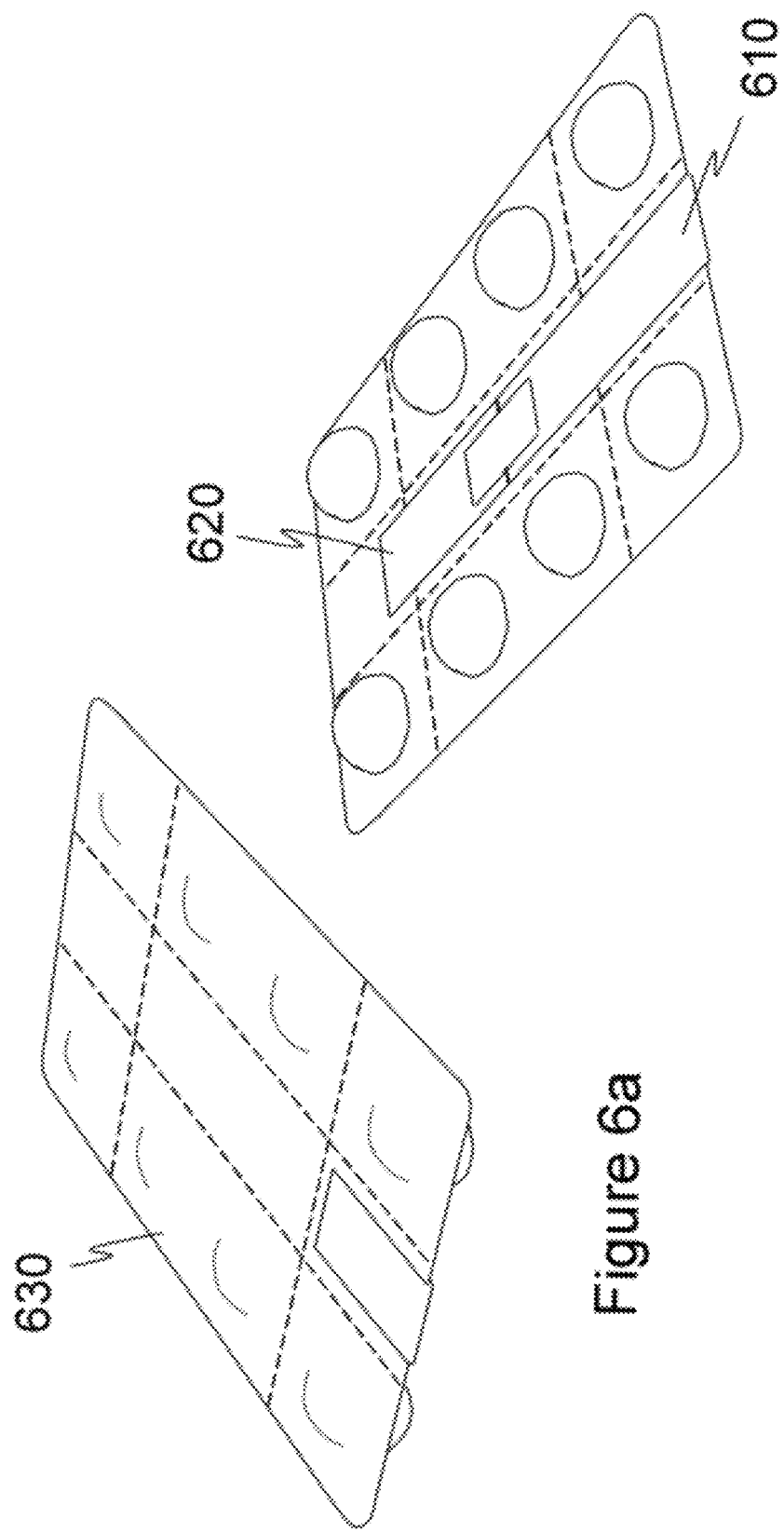

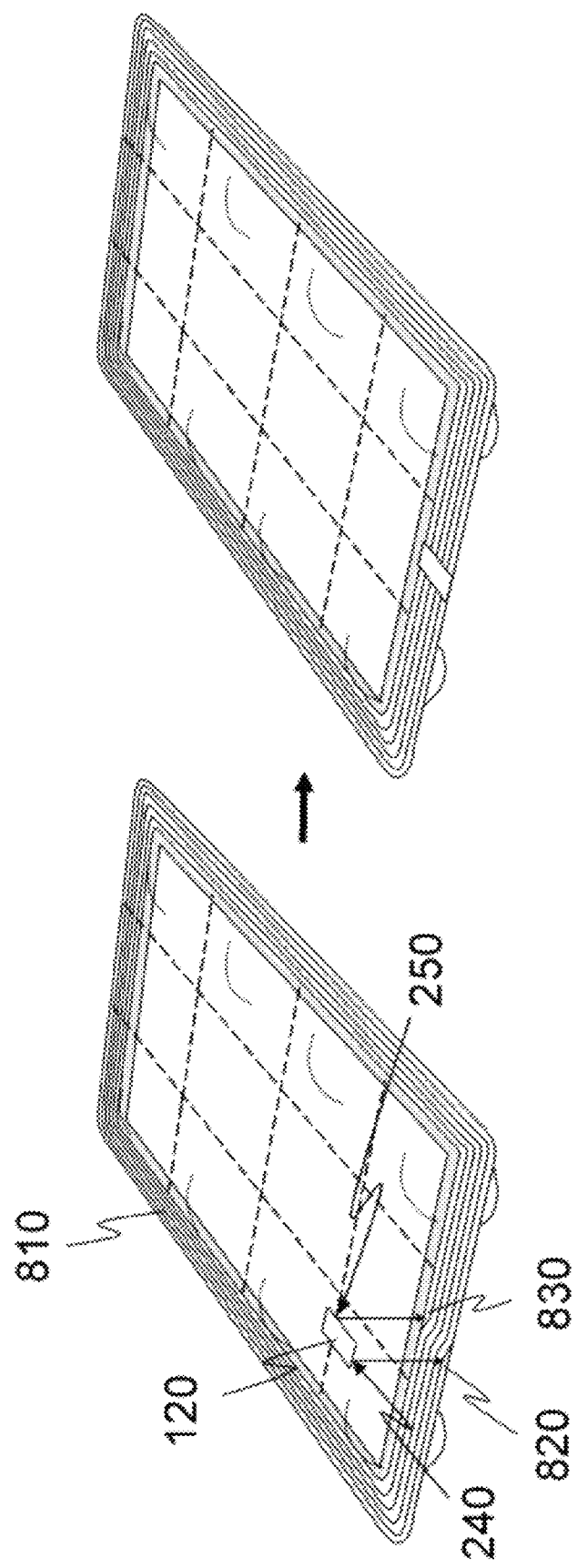

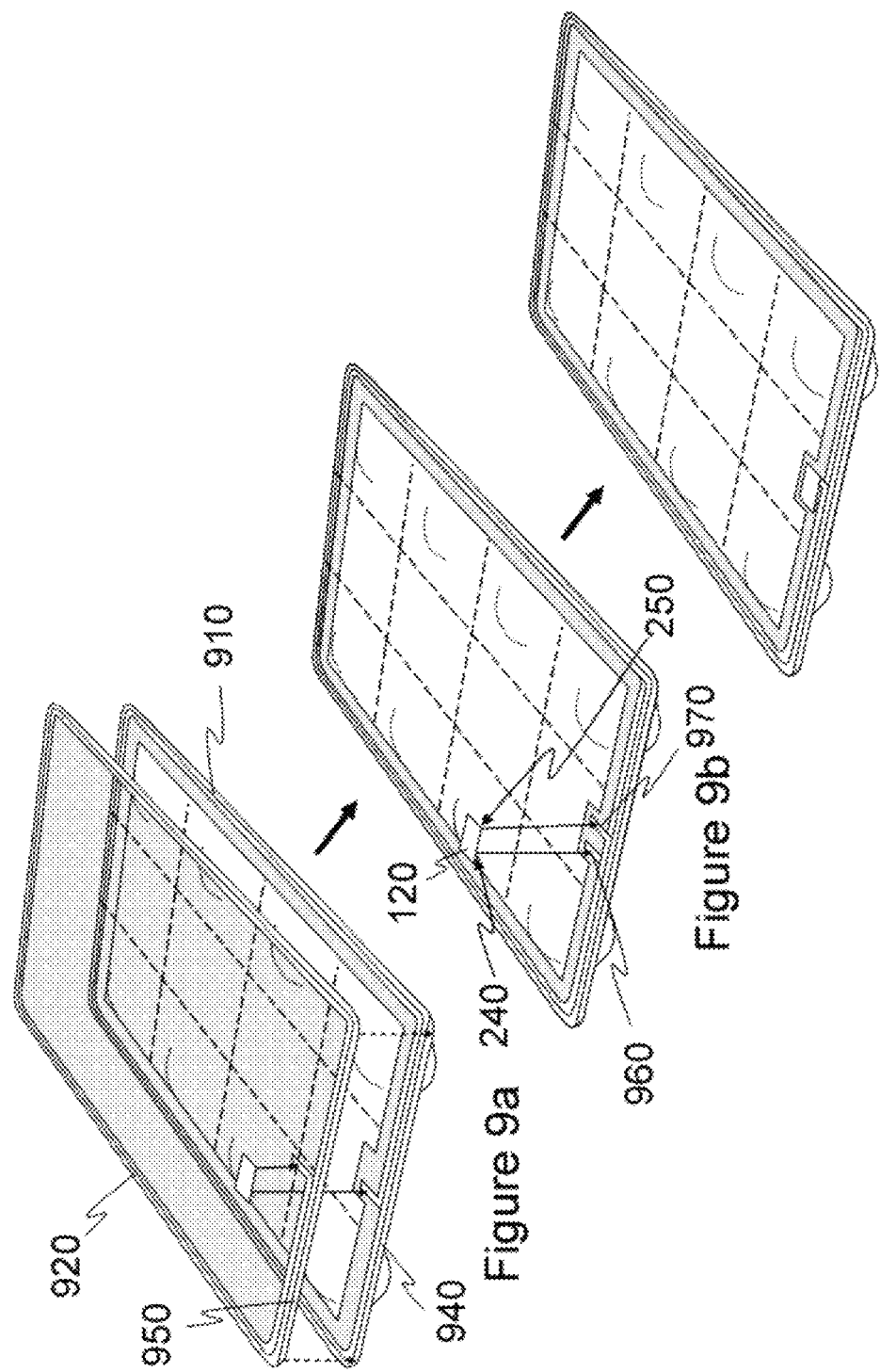

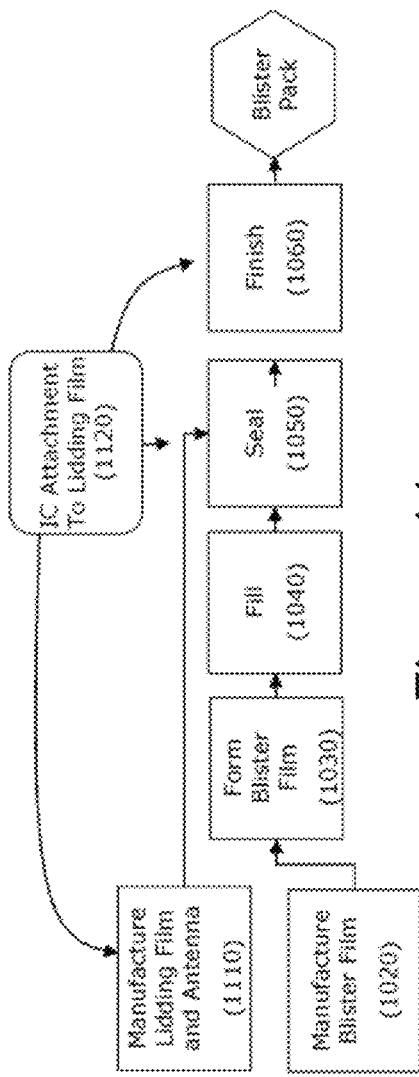
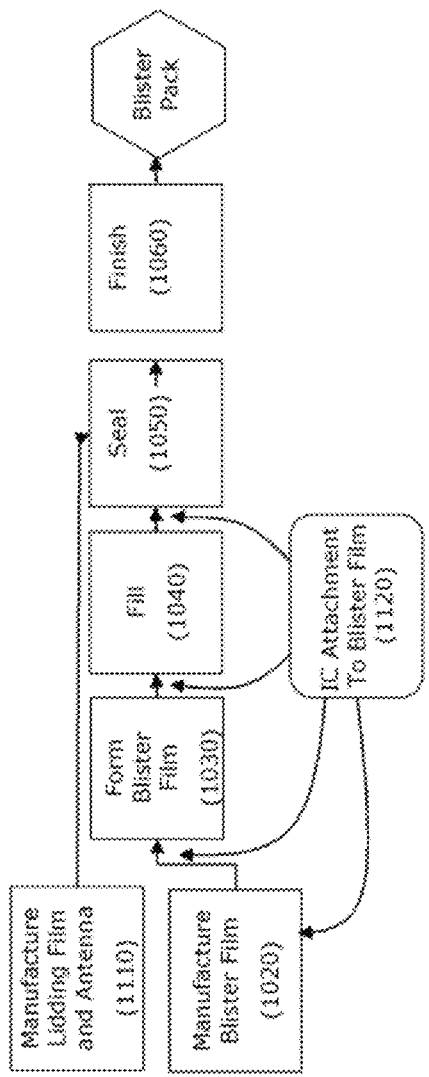
Figure 11a
Figure 11b

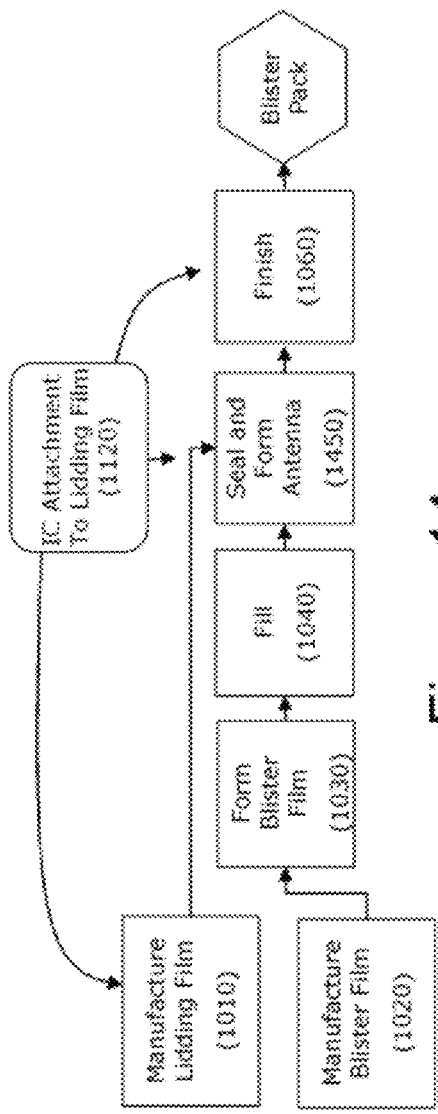
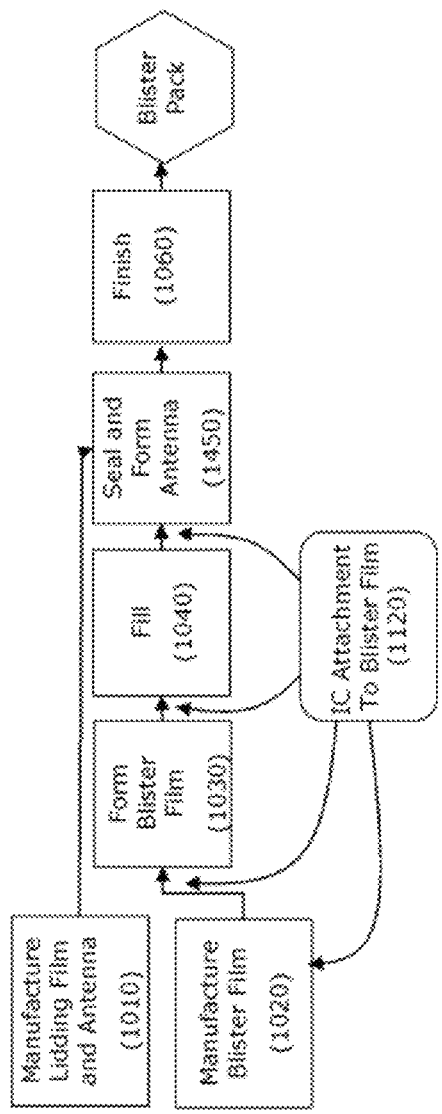

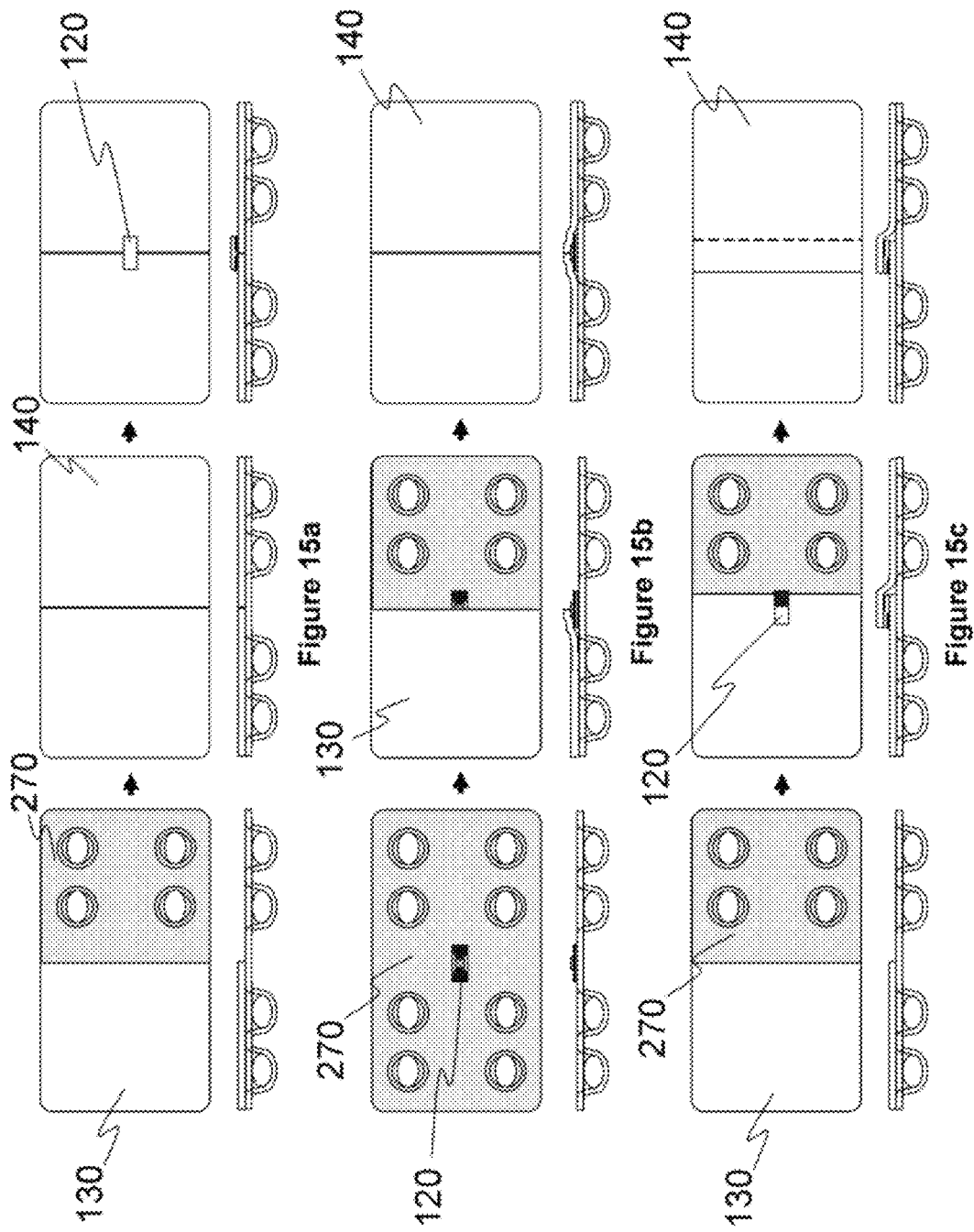

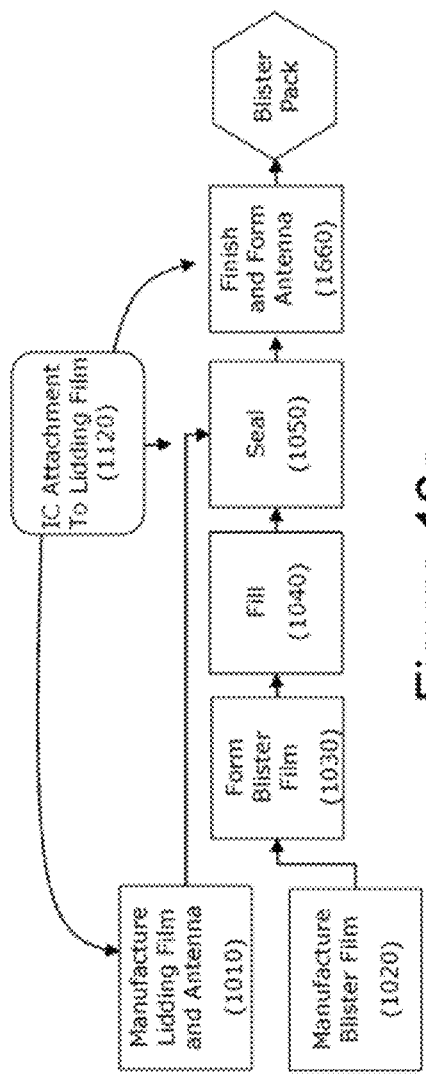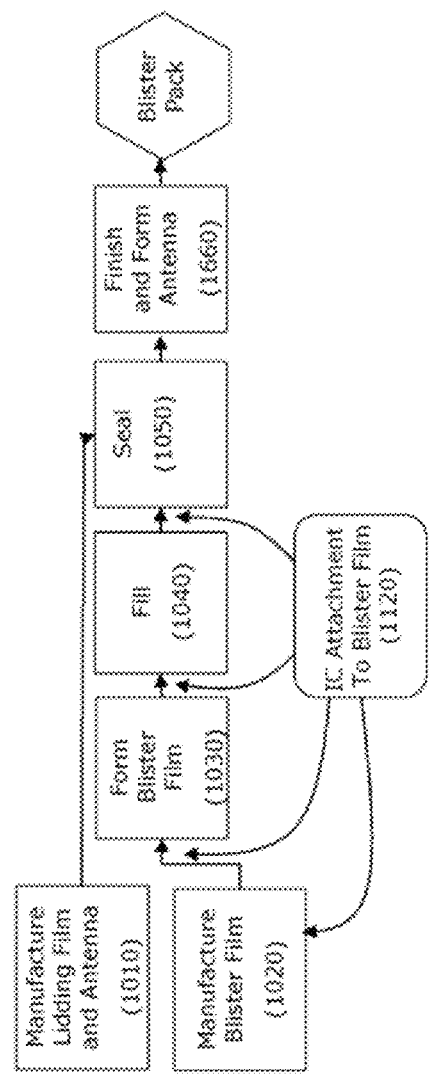

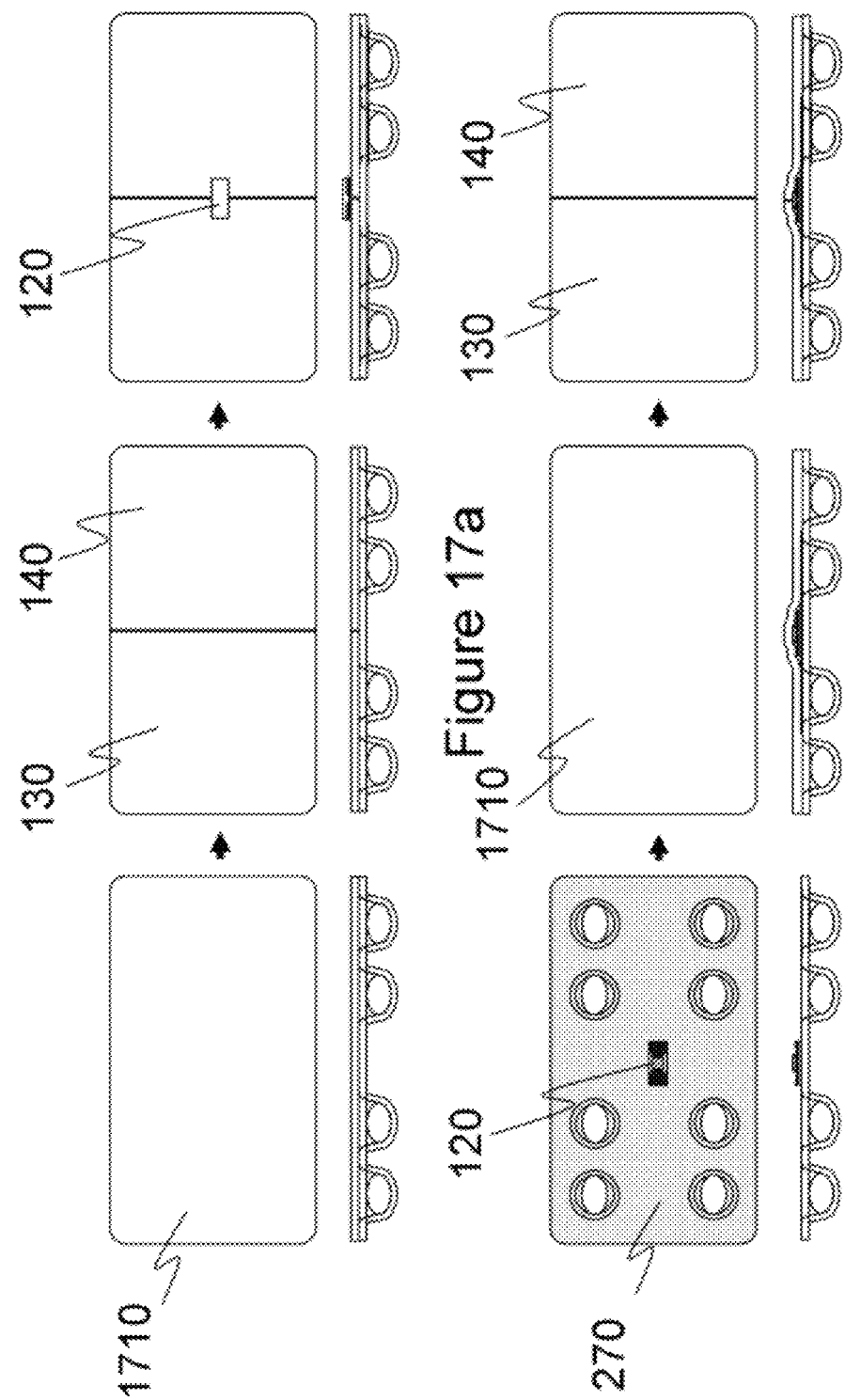

BLISTER PACKAGE WITH INTEGRATED ELECTRONIC TAG AND METHOD OF MANUFACTURE

CROSS REFERENCE TO RELATED APPLICATIONS

This is a continuation of application Ser. No. 10/906,606, filed Feb. 25, 2005, now U.S. Pat. No. 8,120,492, which is incorporated herein by reference in its entirety.

FIELD OF THE INVENTION

This invention relates generally to blister packages, and more particularly, to blister packages with an integrated electronic tag and methods of manufacture.

BACKGROUND OF THE INVENTION AND PRIOR ART

With increasing needs to wirelessly identify and capture data related to physical objects, there has been an increased use of radio-frequency identification (RFID) and barcode technologies. RFID technologies offer the promise of non-line-of-sight identification, reading of many objects simultaneously with a single reader and the promise of supporting greater functionality including sensor inputs and large amounts of rewritable memory. For these reasons RFID has emerged as a preferred automatic identification and data capture technology.

RFID readers or interrogators are used for communicating with and optionally powering tags affixed to objects. Readers can be found in fixed or mobile configurations and may be embedded in a variety of devices, including mobile phones. A unique ID code stored in the tag is communicated to the reader and associated with information in a database. At minimum an RFID tag consists of an electronic circuit attached to an antenna on some substrate. The electronic circuit may be chipless, containing only passive elements (e.g. inductors, capacitors, resistors, diodes), or may contain an integrated circuit containing active electronic devices such as transistors. A reader consists of an RF transceiver unit attached to one or more antennas.

At lower operating frequencies (such as 125 KHz or 13.56 MHz) where the wavelength of the electromagnetic field is large compared to the operating distance, the coupling between the reader and the tag is often described as "near-field" coupling. In this case, the reader antenna and the tag antennas are coupled together either inductively with coils or capacitively with planar electrodes, in which the tag antenna can be resonant or non-resonant.

At higher operating frequencies (such as 915 MHz or 2.45 GHz) where the wavelength of the electromagnetic field is small compared to the operating distance (generally 1 meter or more), the interaction between the reader and the tag is known as "far-field." In this case, the tag communicates information to the reader by reflecting or scattering back some of the electromagnetic field that is incident on the tag. The amount of power that the tag is able to scatter back to the reader is dependent on the antenna shape, size, and tuning, and is generally described by a normalized parameter known as the scattering cross section.

The form of electromagnetic communication between a tag and a reader is important, since it influences the shape and form of the tag and reader antennas. Capacitively coupled antennas may be untuned or tuned and require two electrically disconnected electrodes (see e.g. U.S. Pat. No. 6,611,199). Inductively coupled antennas generally require tuned antennas in the form of a coil. Far-field antennas can employ either one or two electrodes, but also require tuning as well, in order to maximize the scattering cross-section.

RFID tags of all forms present unique challenges to integration with products both electromagnetically and mechanically. Because RFID tags communicate with RFID readers via electromagnetic fields and waves, the product packaging materials and contents can strongly affect communications between reader and tag. Liquid and metallic materials are known to both absorb and reflect electromagnetic energy.

The physical integration of RFID tags with product packaging is generally challenging because many production processes have been well established and are unforgiving to significant changes or additions. Thus, there exists a need for innovative manufacturing methods as well as antenna designs to better integrate RFID tags into existing packaging materials and existing manufacturing methods at a low cost.

In the pharmaceutical industry, blister packages have emerged as a preferred method of packaging items for such reasons as security, product protection, display aesthetics, child-resistance, and medication compliance. Due to the increasing need to provide improved product tracking and tracing capabilities and additional security benefits there is a need to integrate RFID tags with blister packages.

Blister packages have been in use since at least the 1960s for packaging of a variety of products, including items such as toys, tools, chewing gum, and medication. A large body of prior art exists which cover various blister package designs and packaging materials (see e.g. U.S. Pat. No. 3,054,502, U.S. Pat. No. 2,503,493, U.S. Pat. No. 3,380,578, and U.S. Pat. No. 5,954,204).

Due to the existence of electrically conductive lidding film as a key component of the package, however, blister packages present unique challenges to integration of RFID tags. The lidding film typically consists of thin metal foil (0.6-1 mil=10 to 25 microns) and may incorporate additional laminated layers, such as paper or PET, and other coatings, for purposes such as heat sealing and printing. If RFID tag labels are applied to the lidding film, the electrical conductivity of the lidding film can detune RFID tag antennas and reflect electromagnetic fields and waves preventing necessary power transfer and communications—ultimately leading to poor RFID performance.

One solution to this problem is to add spacing or ferrite materials between the RFID tag and the blister package lidding film; however, this can add significant cost to overall package materials and production, while providing only a minor improvement in RFID performance.

Additionally, because the lidding film is designed to seal the contents in the package and act as a protective barrier, simply replacing the lidding film with any RFID tag label is not a viable option. The tag antenna must be designed so that the protective barrier is not compromised. Although various non-metallic non-conductive films have been developed as an alternative to metal foil lidding materials, the metal foils remain the most attractive in terms of cost.

Since the blister seal must not be compromised and also since the surface area between adjacent blisters is limited, an additional challenge is to create an RFID antenna that will fit within the limited available area in between adjacent blisters.

In the case of the tuned coil antenna employed for inductive coupling, it is desirable to maximize the enclosed area of the coil as well as the number of turns in order to maximize the mutual inductance between the tag and reader and also achieve the proper inductance value to enable resonant tuning. In addition, since the thickness of the blister pack foil lidding is generally 30 microns or less, it is necessary to maintain the width of the metal coil traces to a few hundred microns or greater in order to prevent excessive resistive loss in the tag antenna coil. As a result of all these factors, it is a great challenge to create an antenna that will fit within the limited surface area of the blister pack and also avoid cutting the portions of the foil which seal the blisters.

Although there have been several attempts to integrate blister packaging with RFID functionality, these prior inventions rely on antennas and electronic devices that are external to the blister package, and are not an integral part of the blister pack materials themselves. U.S. Pat. No. 6,244,462, for example, describes an external paper box or sleeve, with conductive traces, monitoring circuit, and transceiver into which a conventional blister package is inserted. Other prior art is specifically intended for monitoring the dispensing of medication in unit-dose blister packages, incorporate conductive traces located above the enclosed contents, which when broken, provide an indication that the contents have been removed. U.S. Pat. No. 6,574,166, for example, describes a package for monitoring medication compliance, where the conductive traces for sensing are integrated within the blister package, but the monitoring circuit and transceiver with antenna are located either external to the package or added as extra components to the package itself. The use of external devices or high-conductivity printed layers adds undesirable cost and complexity to the process of blister pack manufacture.

In order to achieve low-cost and large-scale manufacture of blister packages with RFID functionality, there still exists a need for innovative package designs and manufacturing methods which can enable better integration of an RFID circuit and antenna with the existing materials and processes used in blister pack manufacture.

SUMMARY OF THE INVENTION

The present invention describes a blister pack with RFID functionality, where the RFID antenna is created directly from the lidding film of the blister pack. One object of this invention is a blister package with an integrated RFID tag capable of providing good electromagnetic performance, preservation of the packages protective properties, and simple and low-cost mechanical integration. A further object of this invention is to provide methods for manufacturing this blister package that integrate with conventional blister package manufacturing methods.

The present invention includes an electronic circuit, also referred to herein as an integrated circuit (IC) chip and an antenna integrated within the electrically conductive lidding material of the blister package. The lidding film is formed to serve as the antenna and may be comprised of a variety of materials including, but not limited to, foil and conductive adhesives. The electronic circuit may be chipless, containing only passive elements (e.g. inductors, capacitors, resistors, diodes), or may contain an integrated circuit containing active electronic devices such as transistors and formed from materials such as semiconductors or conductive polymers. The IC chip may be attached directly to the lidding film antenna or to an intermediate substrate as an "interposer" or "strap," which is in turn attached to the lidding film antenna Various antenna configurations and geometries may be employed in the antenna design. One embodiment disclosed in the present invention incorporates antennas with a single electrically-conductive region. This embodiment includes coil antennas suitable for inductive coupling as well as folded dipole antennas suitable for far-field operation. An alternate embodiment of the present invention describes antennas comprised of two or more electrically conductive regions, such as dipole or quadropole antennas suitable for capacitive near-field coupling or far-field operation.

For the case of an inductively coupled coil antenna, one embodiment of this present invention describes a two layer coil integrated within the lidding film that enables the manufacture of coil antennas on blister packs with little surface area. This invention enables the use of a small number of turns compared to conventional coil antenna designs, while maintaining a similar level of performance and not compromising the protective barrier over the sealed blisters.

The present invention describes various methods for assembling the blister package with integrated tag. Typically, blister package manufacture and assembly consists of five main stages: manufacture of the lidding and blister films, forming the blister film, filling the blister film, sealing the blister film with the lidding film, and finishing the package including operations such as perforation, cutting, notching and labeling. In the present invention, the steps of forming the antenna from the lidding film and electrically connecting the IC to the antenna are added to the conventional process.

In the present invention, three main variations of the manufacturing method are described. In the first embodiment, the antenna is formed in the film manufacturing stage. In the second alternate embodiment, the antenna is formed during the sealing stage. And in the third alternate embodiment, the antenna is formed or applied in the finishing stage. The second and third embodiments pertain to antennas with simple geometries, such as an untuned dipole antennas often used in capacitive coupling. In all embodiments, the IC or interposer may be placed at various points throughout the conventional process. Depending on the particular embodiment, it may be placed on the blister film with conductive pads facing up such that it is electrically connected to the lidding film only after the package is sealed. It may also be attached directly to the lidding film before or after it has been sealed to the blister film. The various methods are described further in the Detailed Description of the Drawings.

BRIEF DESCRIPTION OF THE DRAWINGS

FIG. 3A-3B illustrates cross-sectional views of an embodiment where an interposer is attached to separate portions of the lidding film. FIG. 3A illustrates the interposer placed above the lidding film. FIG. 3B illustrates the interposer placed between the lidding film and the blister film. FIG. 3C illustrates the interposer placed between two separate layers of lidding film.

FIG. 4A-4B illustrates cross-sectional views of an embodiment where the IC is attached directly to the lidding film. FIG. 4A illustrates the IC chip placed between the lidding film and the blister film. FIG. 4B illustrates the IC chip placed above the lidding film.

FIG. 5A illustrates an embodiment where the antenna comprises two portions of the entire lidding film. FIG. 5B illustrates an embodiment where the antenna is comprised of two overlapping layers of lidding film. FIG. 5C illustrates an embodiment with two conductive layers separated by a dielectric layer. FIGS. 5D and 5E illustrate embodiments where the antenna comprises only a portion of the lidding film. FIG. 5F illustrates an embodiment where the antenna is attached underneath the blister film and electrically connected to one side of the lidding film.

FIG. 6A-6B illustrate a perspective view of the embodiment of FIG. 5F. FIG. 6A illustrates the top side of the embodiment. FIG. 6B illustrates the bottom side of the embodiment.

FIG. 7A illustrates an embodiment suitable as a folded dipole for operation at UHF frequencies. FIG. 7B illustrates an alternate view of the embodiment of FIG. 7A.

FIG. 7C illustrates an embodiment where the antenna is a single layer planar coil. FIG. 7D illustrates an embodiment where the antenna is a double layer planar coil.

FIG. 8A-8B illustrate perspective views of the embodiment of FIG. 7C. FIG. 8A is an exploded view. FIG. 8B illustrates the assembled package.

FIG. 9A-9C illustrate perspective views of the embodiment of FIG. 7D. FIG. 8A is an exploded view. FIG. 8B illustrates the two coil layers assembled. FIG. 8C illustrates the assembled package.

FIG. 11A-11B illustrates the methods of manufacturing the present invention where the antenna is formed in the lidding film manufacturing stage. FIG. 11A illustrates where the IC chip may be attached to the lidding film. FIG. 11B illustrates where the IC chip may be attached to the blister film.

FIG. 12A illustrates a method for manufacturing a single layer antenna. FIG. 12B illustrates a method of manufacturing a double layer antenna where two separate layers are joined. FIG. 12C illustrates an alternate method of manufacturing a double layer antenna where a conductive layer is added to a first formed antenna layer. FIG. 12D illustrates a simpler method of manufacturing a double layer antenna where a dielectric and conductive layer are added directly to the lidding film foil layer.

FIG. 14A-14B illustrate methods of manufacturing the present invention where the antenna is formed in the sealing stage. FIG. 14A illustrates where the IC chip may be attached to the lidding film. FIG. 14B illustrates where the IC chip may be attached to the blister film.

FIG. 15A-15C illustrate graphical views of the methods of manufacturing the present invention where the antenna is formed in the sealing stage. FIG. 15A illustrates two separate portions of lidding film sealed to the blister film and the IC subsequently attached. FIG. 15B illustrates the IC placed first on the blister film and two separate portions of lidding film sealed to the blister film. FIG. 15C illustrates one portion of the lidding film sealed to the blister film, an interposer placed, and a second portion of the lidding film sealed over the uncovered portion of blister film.

FIG. 16A-16B illustrate methods of manufacturing the present invention where the antenna is formed in the finishing stage. FIG. 16A illustrates where the IC chip may be attached to the lidding film. FIG. 16B illustrates where the IC chip may be attached to the blister film.

FIG. 17A-17B illustrate methods of manufacturing the present invention where the lidding film is cut to form the antenna. FIG. 17A illustrates a method where the lidding film is first cut and the IC then attached. FIG. 17B illustrates a method where the IC is first placed on the blister film, the package sealed, and the lidding film cut.

FIG. 18A illustrates a method where a dipole antenna is added to the top of an uncovered portion of blister film. FIG. 18B illustrates a method where a dipole antenna is added to the bottom of the blister film and attached to one side of the lidding film. FIG. 18C illustrates a method where a conductive layer over a dielectric layer are added to the top of the lidding film.

DETAILED DESCRIPTION OF THE FIGURES

Figure 1:
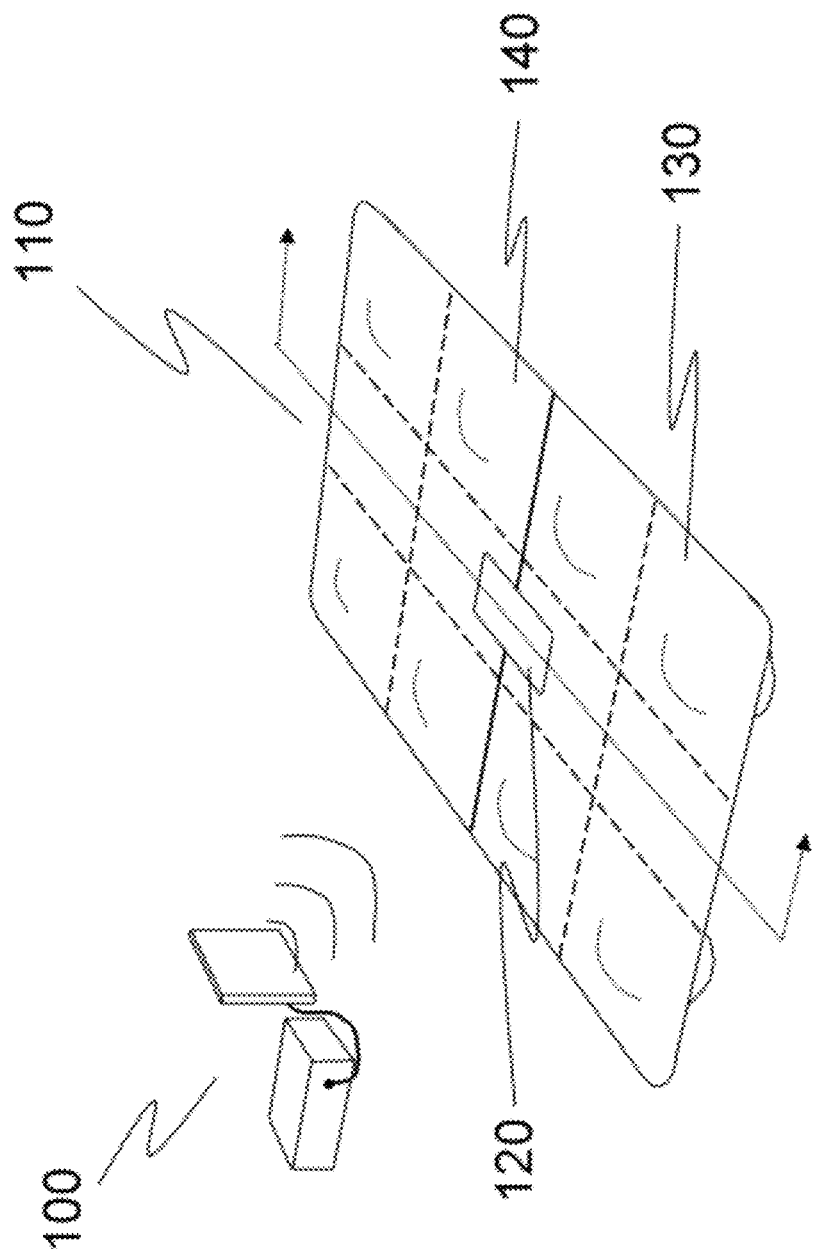
FIG. 1 illustrates a perspective view of a blister package with an integrated RFID tag being remotely interrogated by a reader.

FIG. 1 shows an RFID reader 100 wirelessly communicating with one embodiment of the blister pack 110 with integrated RFID tag disclosed in the present invention. The blister pack is comprised of interposer 120 attached to two portions of the electrically conductive patterned lidding film 130, 140 that function as the RFID tag antenna.

Figure 2:
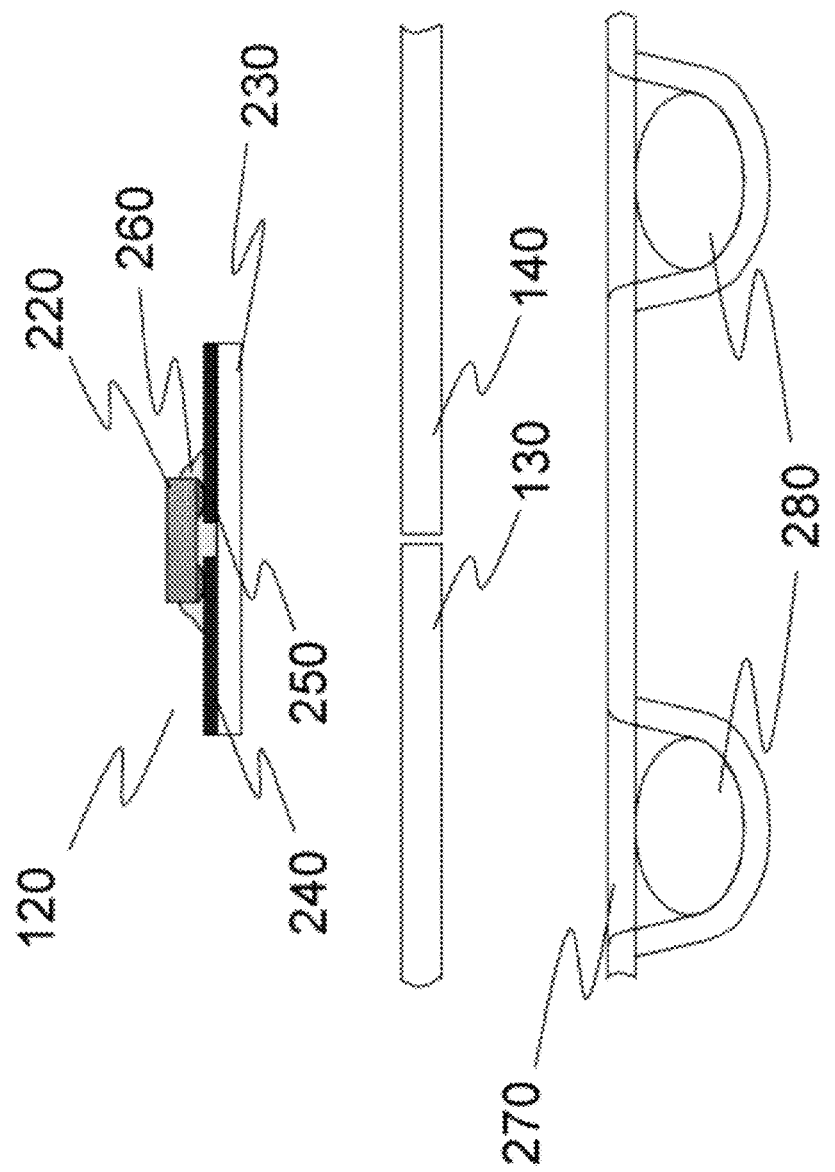
FIG. 2 illustrates an exploded cross-sectional view of the components of the embodiment of FIG. 1, including interposer assembly with IC chip, conductive lidding film, and formed blister film.

FIG. 2, shows a cross-sectional view of the components of the embodiment of FIG. 1. The interposer 120 is comprised of an IC chip 220 on insulating substrate 230 secured to two electrically conductive pads 240, 250 with adhesive 260. Also shown in FIG. 2 is the formed blister film 270 with product contents 280 and metal foil lidding 130, 140.

FIGS. 3a, 3b and 3c show the cross-sectional view of the assembled blister pack, comprised of IC and interposer, lidding foil and blister film. As shown in FIGS. 3a, 3b, and 3c, each of the electrically conductive pads of the interposer is connected to an electrically conductive region 130, 140 of the lidding film and secured by an adhesive 310. As shown in FIG. 3a, an interposer 120 may be attached above the electrically conductive lidding film 130,140 or as shown in FIG. 3b, the interposer 120 may also be attached between the lidding film 130, 140 and the formed blister film 270. FIG. 3c shows a third embodiment where an interposer 120 is placed between two separate portions of the electrically conductive lidding film 130, 140. Various means may be employed to electrically connect each side of the interposer 240, 250 to a respective portion of the lidding film 130, 140. In FIG. 3c, one pad 240 of the interposer is connected to one side of the lidding film 140 through a conductive adhesive 310. The other pad 250 of the interposer is electrically connected to a conductive region 330 on an additional substrate 340 which is in-turn electrically connected to a portion of the lidding film 130. In other embodiments the additional substrate 340 with conductive region 330 may be replaced by a strip of isotropic conductive adhesive, or the interposer itself may have one pad 250 with electrically conductive regions on both front and back which are electrically continuous.

FIG. 4a and FIG. 4b illustrates direct attachment of the IC chip to the lidding film without the need for the intermediate interposer substrate. As shown in FIG. 4a, the IC chip 220 may be attached above the electrically conductive lidding film 130,140 or as shown in FIG. 4b, the IC chip 220 may also be attached between the lidding film 130, 140 and the formed blister film 270. In both FIGS. 4a and 4b, the IC chip is secured to the electrically conductive lidding film by an adhesive 260.

In general, the electrical connection between the IC chip and the antenna can be assured through electrically conductive adhesive between pad and substrate, electrically nonconductive adhesive underfill or overfill, lamination, ultrasonic welding, and any other methods known in the art. Due to the existence of coating or lamination layers, various methods such as ultrasonic welding, piercing, or removing with a solvent, may be employed to ensure electrical connection.

FIGS. 5 and 6 illustrate a variety of antenna patterns that are consistent with the present invention. FIG. 5 depicts several antenna designs comprised of a two or more electrically conductive regions, and FIG. 6 depicts several antenna designs comprised of one electrically conductive regions.

Further, in some embodiments antennas have a single electrically conductive layer, whereas in others, they have two electrically conductive layers.

Figure 5A:
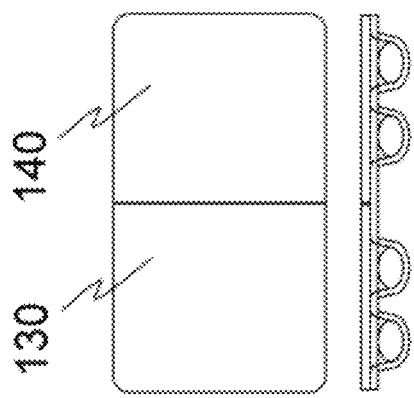
FIG. 5A-5F illustrates embodiments where the antenna has two electrically conductive regions.
Figure 5B:
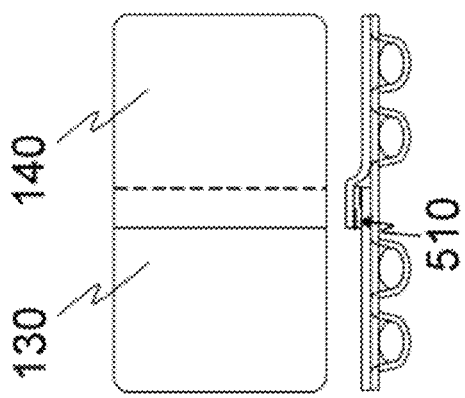
Figure 5C:
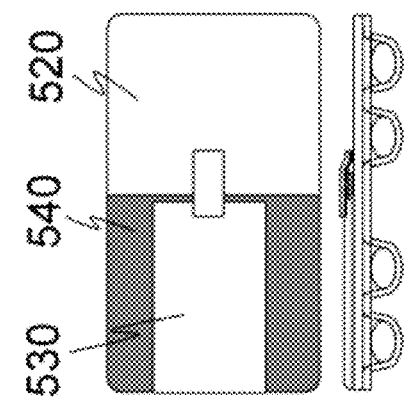

FIG. 5a-5f illustrate embodiments where antennas have two electrically conductive regions. In the embodiment of FIG. 5a, also shown in FIG. 1, the antenna comprises the entire lidding film and consists of only two portions 130, 140 with a single dividing line. Each portion 130 and 140 may overlap as long as they remain electrically disconnected; this can be accomplished, for example, through the use of a non-conductive coating over the foil layer. An IC or interposer may be placed above or below the lidding film. The embodiment of FIG. 5b also comprises the entire lidding film and has two portions 130,140; however, an interposer 510 is placed between the two lidding film portions. FIG. 5c illustrates an embodiment of a two region antenna with two conductive layers. The lidding film 520 serves as one conductive element of the antenna, and an additional conductive layer 530 forms the second element of the antenna separated by a dielectric layer 540. These embodiments of FIGS. 5a-5c are particularly suitable for capacitive coupling.

Figure 5D:
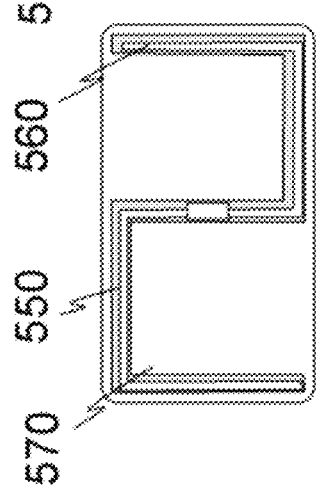
Figure 5E:
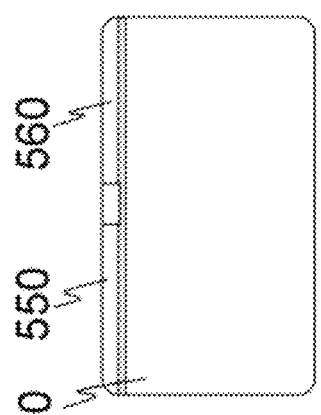
Figure 5F:
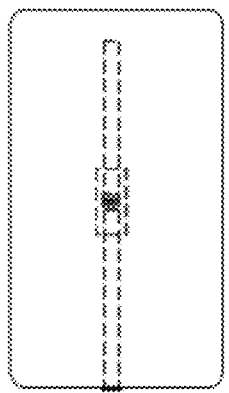

FIGS. 5d and 5e illustrate embodiments where the antenna with two conductive regions 550, 560 comprises only a portion of the lidding film. A remaining portion 570 is not part of the antenna. FIG. 5f illustrates an embodiment where a portion of the antenna and tag assembly extends underneath the blister film. This embodiment is shown in greater detail in FIG. 6. Two conductive regions 610 and 620 are attached to the bottom of the blister layer and one side is attached to the conductive lidding film 630. The embodiments of FIGS. 5d-f, and FIG. 6 may be suitable for near-field capacitive coupling or far-field operation.

Figure 7B:
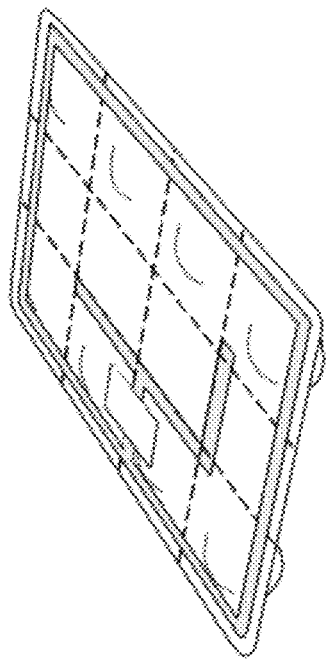
FIG. 7A-7D illustrates embodiments where the antenna has one electrically conductive region.
Figure 7D:
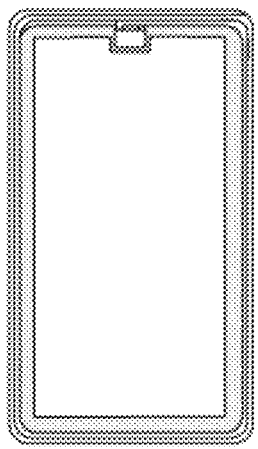
Figure 7A:
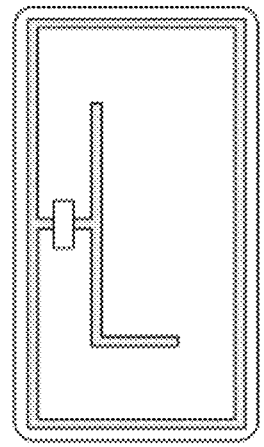
Figure 7C:
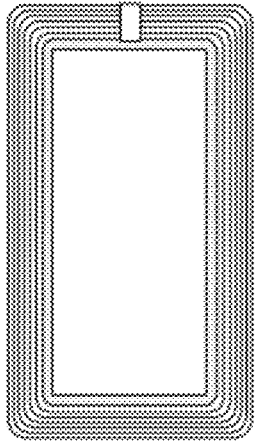

FIGS. 7a, 7c, and 7d illustrate embodiments where antennas have one electrically conductive region. In FIG. 7a, the top view of one embodiment is shown incorporating a folded dipole antenna suitable for far-field coupling. An perspective view of the same embodiment is shown in FIG. 7b. FIG. 7c, shows an embodiment where the antenna comprises a planar coil generally suitable for inductive coupling. Exploded and complete perspective views of the same embodiment are shown in FIGS. 8a and 8b respectively. The interposer 120 is attached across the coil 810 such that each pad of the interposer 240, 250 is electrically connected to one end of the coil 820, 830.

FIG. 7d shows an embodiment incorporating a two layer coil. FIGS. 9a-c show perspective views of the same embodiment. Two overlapping coil layers 910, 920 are electrically connected at one end 940, 950, and the interposer 120 placed across the other ends 960, 970 of each coil layer such that each pad of the interposer 240, 250 is electrically connected to the coils at ends 960, 970. This embodiment provides the advantage of fewer coil turns and smaller surface area than the single layer coil embodiment of FIG. 7a, while achieving similar performance. This embodiment may be particularly appropriate where the surface area of the blister package is limited and a large number of turns is not available.

Several preferred manufacturing methods are also described for the current invention. A typical blister packaging manufacturing process consists of first manufacturing the films and then assembling the package. Blister films are typically created by an extrusion process, and may be coated or laminated with additional layers to produce a better moisture and/or oxygen barrier. These films are also generally cut to an appropriate width. Likewise, the metal lidding films are typically created by first extruding a metal foil, optionally laminating with other materials (i.e. PET and/or paper), coating with heat seal or print primer, printing, and finally cutting or slitting.

Figure 10:
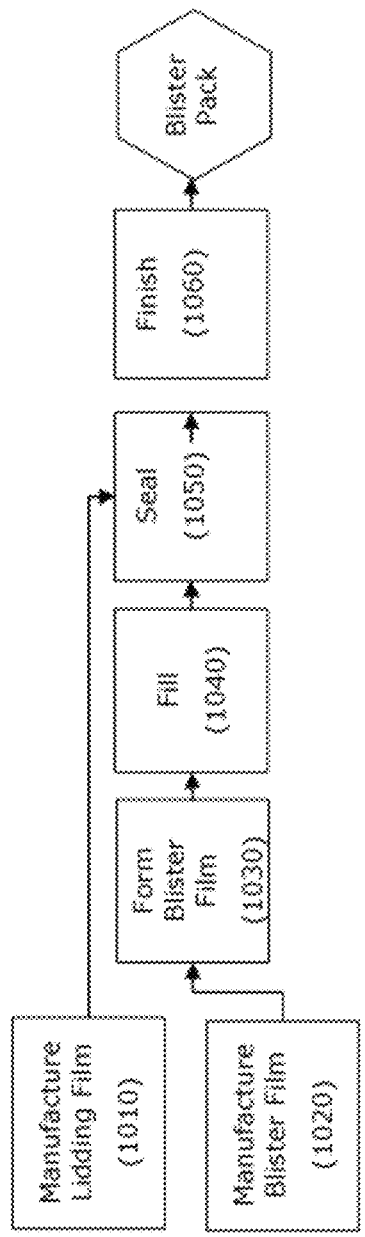
FIG. 10 illustrates the conventional blister package manufacturing process.

As shown in FIG. 10, a entire process of blister package assembly, consists of the following manufacturing stages: Forming the blister film; Filling the blister film; Sealing the package; and Finishing the package. Each manufacturing stage may include one or more steps that can be performed manually or automated by specific machinery.

The method of forming the blister film varies with the material used. Plastic films most often are thermoformed, and are first heated and then formed. Aluminum blister films are typically coldformed, so no heating step is involved.

In the sealing stage, the lidding film is layered over the blister film, heated to a particular temperature where the films fuse, and then cooled.

The finishing stage consists of a variety of operations or steps which may include, perforating, cutting, notching, and/or labeling.

In the current invention, two new steps are introduced: forming the antenna and attaching the IC chip to the antenna. The antenna may be formed as part of the film manufacturing step, as part of the sealing step, or as part of the finishing step. Each of these is described separately in the sections that follow. Placement and attachment of the IC chip can take place at many stages in the manufacturing process, and are illustrated in several embodiments.

FIG. 11 illustrates how the antenna forming can be combined with the lidding film manufacture. The methods illustrated in FIG. 11A and FIG. 11B can each be used to produce single conductive region antennas (FIGS. 7a,c,d), as well as antennas containing two or more conductive regions (FIGS. 5a-e). These antennas may be formed by additive or subtractive processes known in the art, including but not limited to deposition, electroplating, etching, and die-cut.

FIG. 11 also illustrates the exact points in the manufacturing process where the IC can be attached. FIG. 11A illustrates the different stages in the manufacturing process where the IC attachment and electrical connection to the lidding film can be performed. As an alternative to the assembly process of FIG. 11A, FIG. 11B illustrates the different stages in the manufacturing process where the IC can be attached to the blister film instead, such that the electrical connection is made to the lidding film once the package is finally sealed.

The lidding film and antenna forming step 1110 shown in FIG. 11 is illustrated in greater detail in FIGS. 12A, 12B, 12C, and 12D.

Figure 12A:
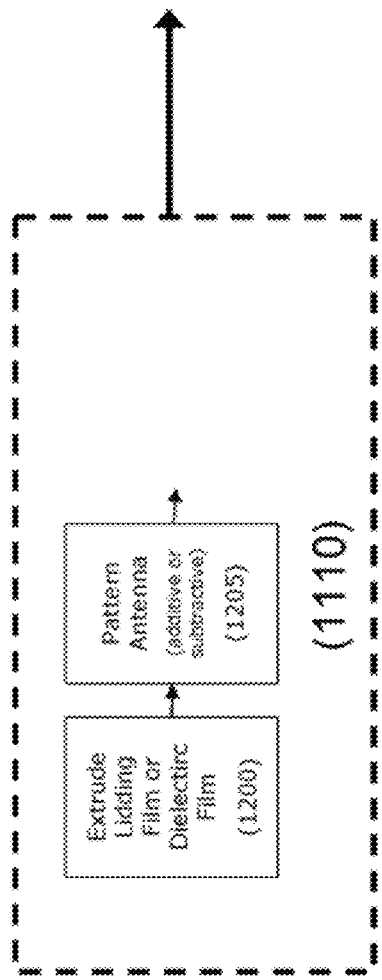
FIG. 12A-12D illustrates methods of manufacturing the antenna in the lidding film manufacturing stage.

FIG. 12a illustrates the simple sequence for the film manufacture and antenna forming steps for a single-layer antenna. The antenna forming step here can be additive, as in the printing, sputter deposition or electroplating of metal, or can also be subtractive where selected areas of metal are removed by chemical etching, plasma etching, laser ablation, or similar means.

Figure 12B:
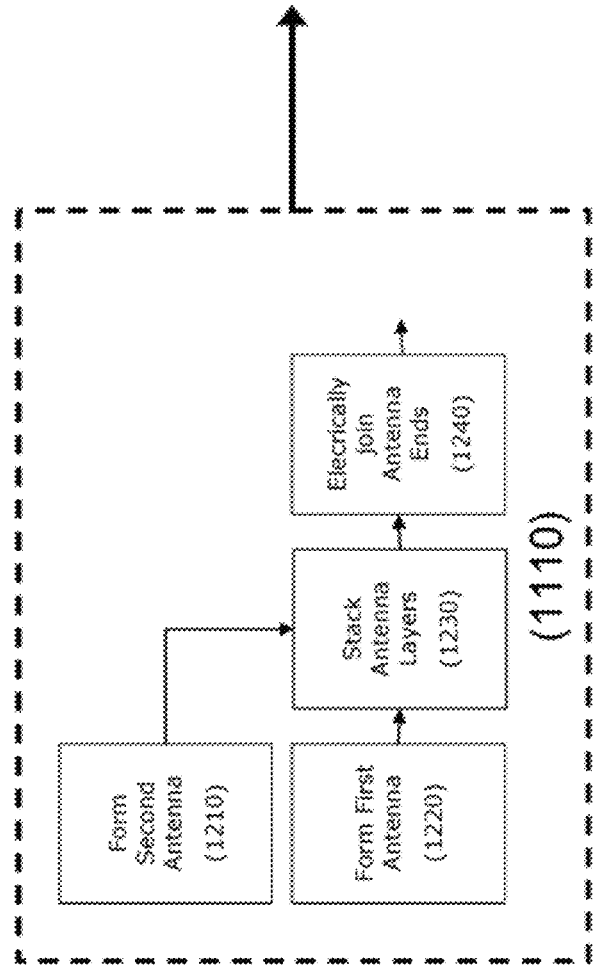

FIG. 12b illustrates a sequence of steps for forming a two-layer antenna, such as that illustrated in the antenna embodiment shown in FIG. 7d. In this case, each antenna layer is patterned on a separate piece of lidding film and then the two layers are stacked and in step 1240, electrically joined together. For the antenna embodiment of FIG. 5c, the step 1240 of electrically joining two electrically conductive layers may be skipped.

Figure 12C:
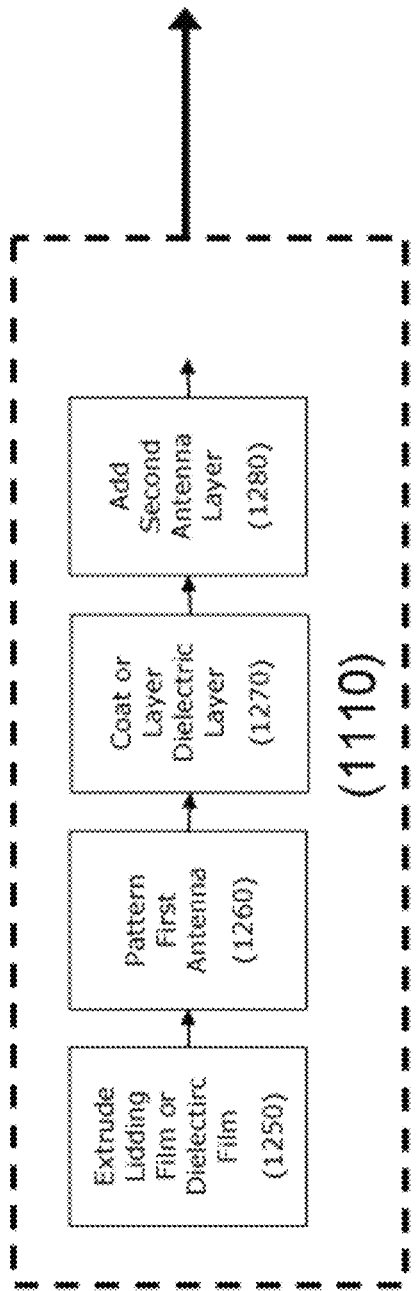

FIG. 12c illustrates alternate means of forming a two-layer antenna such as those shown in FIG. 5c and FIG. 7d. In this case, the first antenna layer is patterned by an additive or subtractive process, such as metal deposition, printing or etching. An insulating dielectric layer is then deposited or printed over a portion of the first antenna layer. Then, a second metal layer is deposited or printed over the dielectric to, where necessary, for the particular embodiment achieve electrical connection to the first metal layer.

Figure 12D:
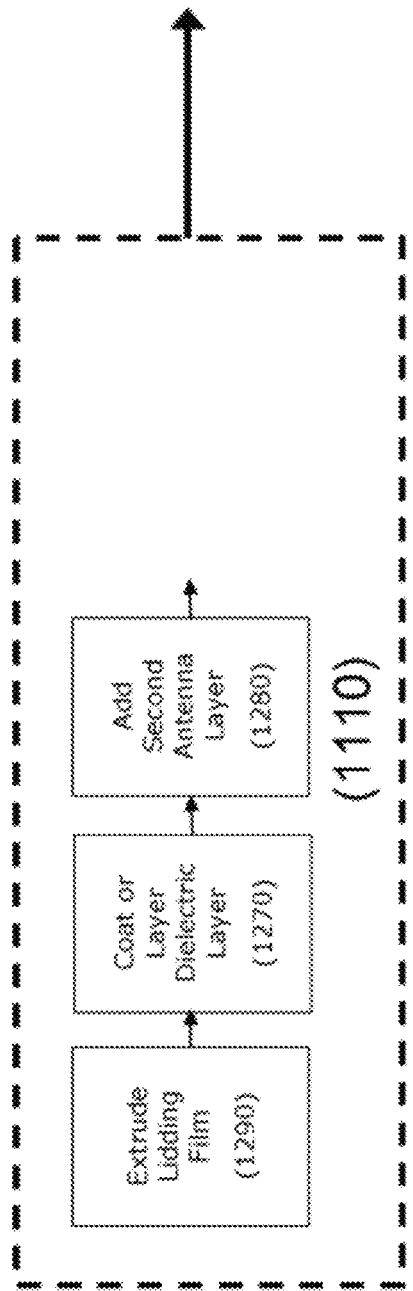
Figure 13:
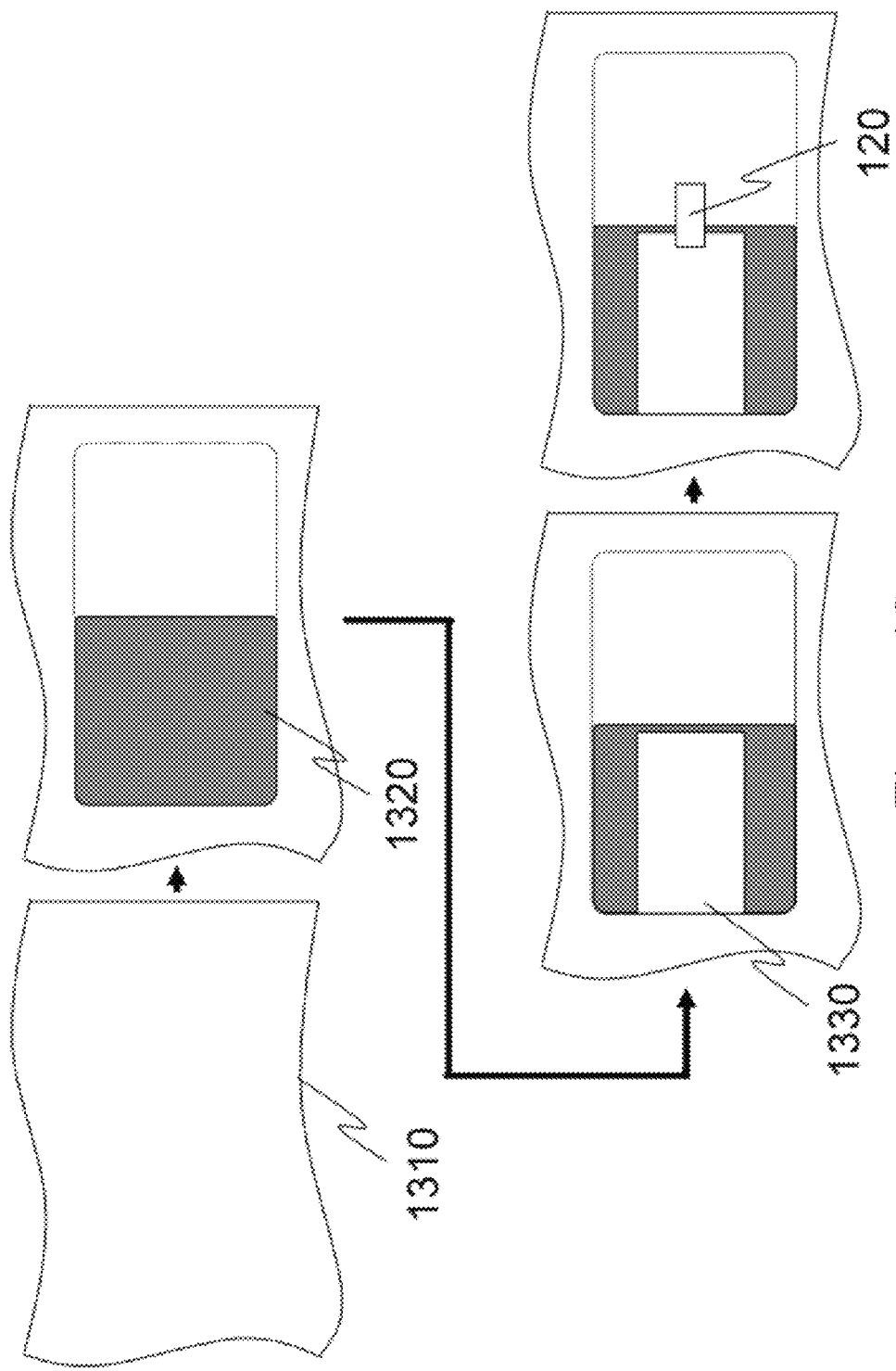
FIG. 13 illustrates further the method of FIG. 12D.

FIG. 12d and FIG. 13 illustrate the particularly simple case of a two-layer antenna that does not require any patterning of the first metal layer. This antenna is particularly suited for operation via capacitive-coupling. As shown in FIG. 13, a dielectric layer 1320 is applied to a foil lidding material 1310, followed by a conductive layer 1330 which is then applied to the dielectric layer 1320. Finally an IC or interposer may be attached across the conductive layer 1330 and the foil lidding film 1310 at this or other stages.

In contrast to FIG. 11, FIG. 14 illustrates an alternative manufacturing process for a blister pack, where the antenna forming occurs in the sealing stage 1450. This manufacturing process may be used to produce antennas of the type shown in FIGS. 5a and 5b.

FIG. 15 further illustrates how the sealing stage may be used to form an antenna. In FIG. 15a, two separate electrically disconnected portions of lidding film 130, 140, are placed over the blister film, then the IC, in this case on an interposer 120, is later attached across these two conducting regions. In FIG. 15b, the interposer 120 is first attached to the blister film 270 and then portions of lidding film 130, 140 are placed over it to make electrical contact to the IC. In FIG. 15c, one portion of the lidding film 130 is first placed over the blister film 270, then the IC on interposer 120 placed over it, and finally the second portion of lidding film is attached 140. The method of 15c is appropriate for the embodiment of FIGS. 3c and 5b.

In contrast with FIG. 11 and FIG. 14, FIG. 16 illustrates an alternative assembly process for a blister pack, where the antenna may be formed in the finishing stage. In this manufacturing method, the antenna forming occurs after the basic blister pack has been formed and sealed. Using this method, it is possible to create the blister pack embodiments depicted in FIG. 5a, FIG. 5c, FIG. 5e, FIG. 5f, and FIG. 6.

FIG. 17a shows how an antenna can be formed simply by cutting or scoring the lidding film 1710 to create two electrically disconnected regions 130, 140, then placing the IC, in this case on an interposer 120, across these regions. FIG. 17b shows how the IC interposer 120 may be placed onto the blister film 270 first, then in step 1050, sealed with the lidding film 1710, and then in the finishing step 1660, the lidding film 1710 is simply cut or scored to electrically isolate the two portions of the antenna 130, 140.

Figure 18A:
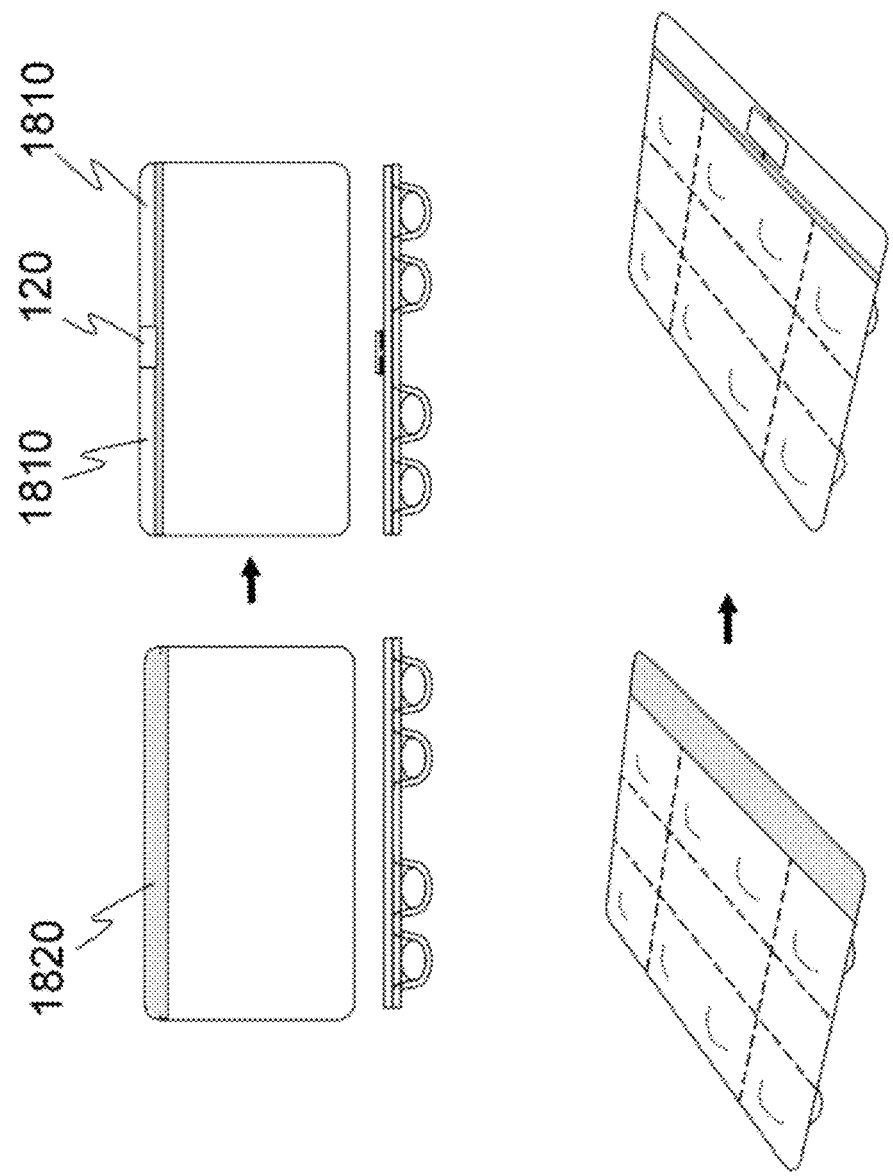
FIG. 18A-18C illustrate methods of manufacturing the present invention where the antenna is added to the blister package in the finishing stage.
Figure 18B:
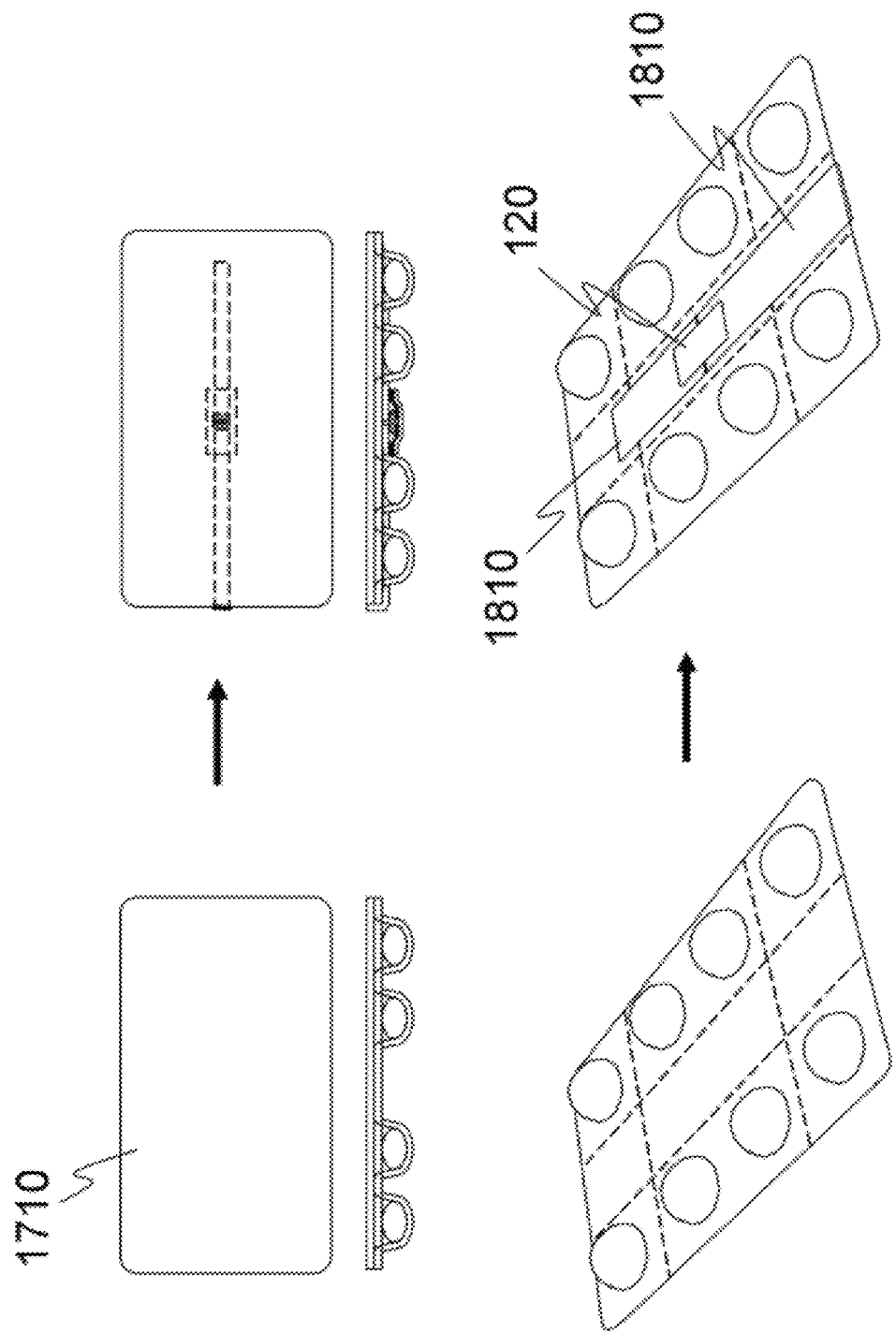
Figure 18C:
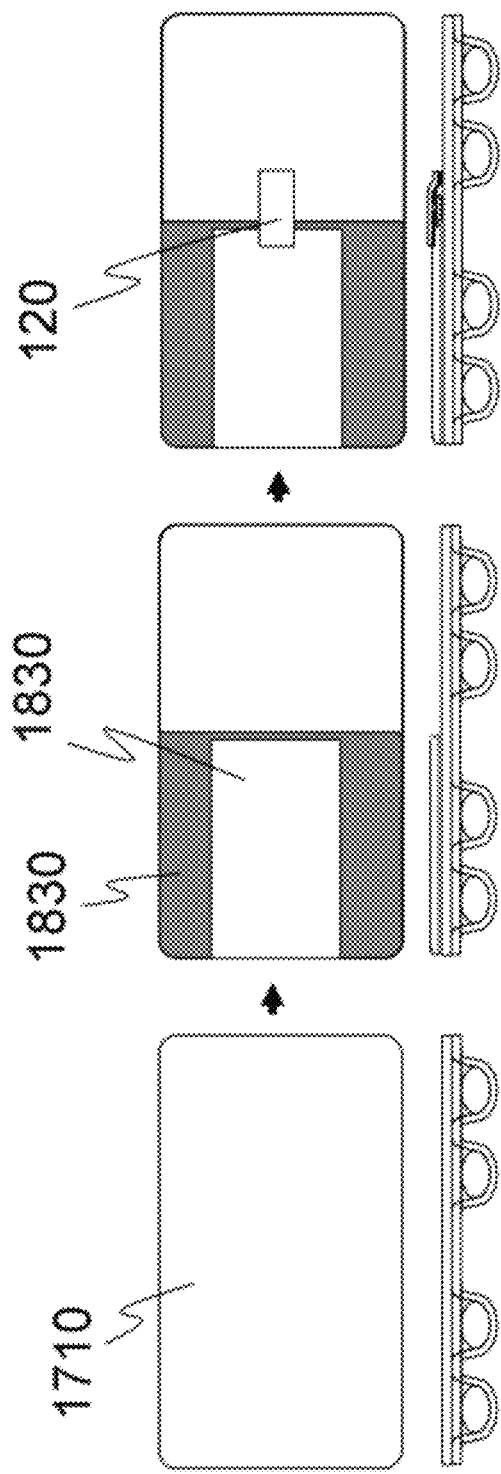

FIG. 18a shows how an antenna 1810 can be added to an exposed area of blister film 1820 on a previously sealed blister package. FIG. 18b shows how an antenna 1810 and interposer 120 can be placed onto the underside of a finished blister pack and optionally electrically connected to the top lidding film for better electrical performance. FIG. 18c shows how a dielectric layer 1830 can be deposited onto a portion of a finished blister pack, and then a second conducting layer 1830 and IC, in this case on interposer 120, added to complete the antenna assembly.

While this invention has been described in terms of several embodiments and specific examples, there are alterations, permutations, and equivalents which fall within the scope of this invention and protection granted by this Letters Patent. It is therefore intended that the following appended claims be interpreted as including all such alterations, permutations, and equivalents as fall within the true spirit of the present invention.

What is claimed is:

1. A blister package lidding layer for a blister package with integrated electronic tag wherein said blister package comprises one or more cavities, each cavity configured to contain an item, said lidding layer comprising
    a lidding film for closing the openings of said cavities, wherein said lidding film contains one or more electrically conductive regions; and
    an electronic circuit with two or more electrical connections to at least one of said electrically conductive regions, arranged to provide wireless electronic communication with an external RFID reader device.

2. The blister package lidding layer of claim 1 wherein said electronic circuit is comprised of an integrated circuit.

3. The blister package lidding layer of claim 2 wherein said integrated circuit is comprised of an electronic polymer circuit.

4. The blister package lidding layer of claim 2 wherein said lidding film is comprised of a metal foil.

5. The blister package lidding layer of claim 2 wherein said lidding film is comprised of an electrically conducting polymer film.

6. The blister package lidding layer of claim 2 wherein said lidding film comprises a first electrically conductive layer which closes the openings of said cavities, and a dielectric layer provided so as to cover a portion of said first electrically conductive layer, and a second electrically conductive layer disposed over a portion of said dielectric layer, arranged to provide wireless electronic communication with an external RFID reader device.

7. The blister package lidding layer of claim 6 wherein said second electrically conductive layer is comprised of printed electrically conductive ink.

8. The blister package lidding layer of claim 2 wherein said electrically conductive regions are arranged to provide wireless electronic communication with an external RFID reader device, and the coupling to said external RFID reader device is capacitive.

9. The blister package lidding layer of claim 3 wherein said electrically conductive regions are arranged to provide wireless electronic communication with an external RFID reader device, and the coupling to said external RFID reader device is capacitive.

10. The blister package lidding layer of claim 2 wherein said electrically conductive regions form a non-resonant antenna capable of electronically communicating with an external RFID reader device; wherein the coupling to said external RFID reader device is capacitive.

11. The blister package lidding layer of claim 2 wherein said electrically conductive regions form an electrically resonant antenna arranged to provide electronic wireless communication with an external RFID reader device.

12. The blister package lidding layer of claim 2 wherein said electrically conductive regions form an antenna having a resonant frequency in the range of 868 MHz to 960 MHz arranged to provide electronic wireless communication with an external RFID reader device.

13. The blister package lidding layer of claim 2 wherein said electrically conductive regions form an antenna having a resonant frequency in the range of 2400 MHz to 2500 MHz arranged to provide electronic wireless communication with an external RFID reader device.

14. The blister package lidding layer of claim 1 wherein said electronic circuit is comprised of a chipless circuit comprising one or more passive electrically resonant elements.

15. The blister package lidding layer of claim 1 wherein said one or more electrically conductive regions are one electrically conductive region patterned into the shape of a planar coil.

16. The blister package lidding layer of claim 15 wherein the coupling of said wireless electronic communication is inductive.

17. The blister package lidding layer of claim 15 wherein said lidding film comprises an additional layer containing an electrically conductive region in the shape of a planar coil that overlaps said planar coil of the lidding film and is electrically connected at one end to said lidding film, and wherein said electronic circuit has electrical connections to said planar coil of said lidding film and said planar coil of said additional layer.

18. The blister package lidding layer of claim 17 wherein the coupling of said wireless electronic communication is inductive.

19. A method for fabricating a blister package lidding layer for a blister package with integrated electronic tag and antenna wherein said blister package comprises one or more cavities, each cavity configured for containing an item, the method comprising:
(a) providing a lidding film;
(b) patterning of said lidding film to form one or more distinct electrically conductive regions, said regions arranged such that when sealed over said cavities, any of said contained items are not exposed; and
(c) attaching an IC chip after step (a) to said patterned lidding film.

20. A method for fabricating a blister package lidding layer for a blister package with integrated electronic tag and antenna wherein said blister package comprises one or more cavities, each cavity configured for containing an item, the method comprising:
(a) providing a first lidding film;
(b) patterning of said lidding film to form one or more distinct electrically conductive regions, said regions arranged such that when sealed over said cavities, any of said contained items are not exposed; and
(c) depositing a dielectric coating over portions of said first lidding film;
(d) adding a second lidding film with one or more distinct electrically conductive regions over said dielectric coating and at least a portion of said first lidding film such that one edge of said first lidding film is electrically connected to said first lidding film; and
(e) attaching an IC chip to said second lidding film after step (d), such that electrical contact is made between IC chip and first lidding film and between IC chip and second lidding film.

* * * * *